United States Patent [19]

Hatta et al.

[11] Patent Number: 5,126,828
[45] Date of Patent: Jun. 30, 1992

[54] WAFER SCALE INTEGRATION DEVICE

[75] Inventors: Muneo Hatta; Susumu Takeuchi; Hiroshi Tobimatsu, all of Hyogo, Japan

[73] Assignee: Mitsubishi Denki Kabushiki Kaisha, Tokyo, Japan

[21] Appl. No.: 501,211

[22] Filed: Mar. 29, 1990

[30] Foreign Application Priority Data

Apr. 7, 1989 [JP] Japan ............... 1-89348

[51] Int. Cl.⁵ ............... H01L 23/04; H01L 23/02
[52] U.S. Cl. ............... 357/74; 357/65; 357/80; 357/55
[58] Field of Search ............... 357/74, 80, 55, 65; 361/398

[56] References Cited

U.S. PATENT DOCUMENTS

| | | | |
|---|---|---|---|
| 4,302,767 | 11/1981 | Eisele | 357/79 |
| 4,467,400 | 8/1984 | Stopper | 361/403 |
| 4,847,732 | 7/1989 | Stopper et al. | 357/2 |
| 4,857,988 | 8/1989 | Fottler | 357/74 |
| 4,899,208 | 2/1990 | Dietsch et al. | 357/74 |
| 4,901,136 | 2/1990 | Neugebauer et al. | 357/74 |
| 4,920,454 | 4/1990 | Stopper et al. | 361/398 |
| 4,965,653 | 10/1990 | Otsuka | 357/68 |

FOREIGN PATENT DOCUMENTS

| | | | |
|---|---|---|---|
| 63-198340 | 2/1987 | Japan . | |
| 63-229841 | 9/1988 | Japan | 357/74 |
| 1-4032 | 1/1989 | Japan | 357/74 |
| 1-100912 | 4/1989 | Japan | 357/74 |
| 2071195 | 9/1981 | United Kingdom . | |

OTHER PUBLICATIONS

Christian Val, "Wafer Scale Integration (WSI) Packaging," *Wafer Scale Integration*, Elsevier Publishers B. V. (North-Holland) ©IFIP 1986, pp. 321-344.

Primary Examiner—Andrew J. James
Assistant Examiner—Viet Q. Nguyen
Attorney, Agent, or Firm—Lowe, Price, LeBlanc & Becker

[57] ABSTRACT

A WSI device comprises a semiconductor substrate having a wafer scale size. An integrated circuit having a unified function is formed on a main surface of the semiconductor substrate. The semiconductor substrate defines various cutouts centrally and/or peripherally thereof. The cutouts serve to extend peripheral regions of the semiconductor substrate. Bonding pads are formed along the extended peripheral regions of the semiconductor substrate. As a result, the number of bonding pads that can be formed is increased to promote multi-functioning of the WSI device.

13 Claims, 10 Drawing Sheets

WAFER SCALE INTEGRATION DEVICE

BACKGROUND OF THE INVENTION

1. Field of the Invention

This invention relates to the construction of a device known as WSI (wafer scale integration) comprising an integrated circuit formed on a wafer and having a unified function.

2. Description of the Background Art

There is a semiconductor device comprising an integrated circuit formed on a single wafer and having a single unified function, such as a CPU (central processing unit) or a microprocessor, which is realized by developing the concept of LSI (large scale integration). Such a semiconductor device is called WSI (wafer scale integration).

An example of known WSI devices is shown in FIGS. 13 and 14. FIG. 13 is a diagrammatic plan of a wafer 1 of the WSI device. FIG. 14 is a schematic perspective view of a WSI package 2 for fitting the wafer 1. The WSI wafer 1 is constructed to be dish-shaped. On the main surface of the WSI wafer 1 is formed an integrated circuit including a multiplicity of logic circuits and the like. A plurality of wire bonding pads 3 are arranged peripherally of the wafer 1.

The WSI package 2 includes a die pad 5 centrally of a package body 4 for supporting the WSI wafer 1. The package body 4 mainly comprises a multi-layer ceramic board. A plurality of inner leads 6 are formed peripherally of the die pad 5. When the WSI wafer 1 is mounted on the die pad 5, the inner leads 6 are opposed to the wire bonding pads 3 of the WSI wafer 1. The inner leads 6 and wire bonding pads 3 are wired together. Further, a seal ring 7 is formed peripherally of, the inner leads 6. The seal ring 7 maintains gas tightness between a lid (not shown) and the package body 4 as assembled. A plurality of outer pins 8 are formed underneath the package body 4. These outer pins 8 are electrically connected through the inner leads 6 to the wire bonding pads 3 of the WSI wafer 1.

FIGS. 15 and 16 show another example of known WSI devices. This WSI device is in the form of a wafer having a substantially square main surface. Its basic construction is the same as that of the foregoing example.

The above WSI devices have the following constructional features as compared with LSI devices:

(1) Because of the numerous logic circuits and memory circuits, a multiplicity of pads are required for communicating signals with the exterior.

(2) It is difficult to shorten the wiring extending to the pads in order to reduce access time on the wafer.

(3) Since individual WSI devices are expensive, a high manufacturing yield is required.

(4) Since many functions are involved, circuit tests are carried out through a plurality of processes for individual functional units.

The WSI device comprises an integrated circuit having many functions as noted above. Consequently, many input and output units are required for communication with the exterior. In other words, the WSI wafer 1 needs to include a multiplicity of wire bonding pads 3 arranged peripherally thereof. As for the WSI package 2, a multiplicity of inner leads 6 and outer pins 8 must be arranged thereon.

On the other hand, there is a minimum to the area required for wire-bonding the wire bonding pads 3 and inner leads 6. That is, metal wires or the like are used for the bonding purposes. The bonds are formed by welding these wires to surfaces of the wire bonding pads 3 and inner leads 6. Thus, the wire bonding pads 3 or inner leads 6 must offer a minimum surface area for allowing the welds to be worked. Further, the circumferential length of the WSI wafer 1 is dependent on the size of the wafer. This inevitably sets a limitation to the number of wire bonding pads 3 that may be arranged peripherally of the WSI wafer 1. The number of inner leads 6 on the WSI package 2 also is limited for the same reason. This limitation to the number of pads is obstructive to formation of a WSI device including high-performance logic circuits or integrated logic circuits and memory circuits and requiring the number of pads beyond such limitation. As far as LSI is concerned, proposals have been made as to the chip construction for securing long circumferences of LSI chips. FIGS. 17 and 18 are perspective views of the LSI chips disclosed in Japanese Patent Laying-Open No. 63-198340. The example shown in FIG. 17 comprises an LSI chip 9 defining an opening 10 centrally thereof. A multiplicity of wire bonding pads 3 are formed on a surface peripherally of the LSI chip 9 and peripherally of the opening 10. In FIG. 18, a rectangular LSI chip 9 defines a cutout 11 on one side thereof. A plurality of wire bonding pads 3 are formed on a surface peripherally of the LSI chip 9 and peripherally of the cutout 11. In each of the illustrated examples, the region for arranging the wire bonding pads 3 is extended by utilizing the opening 10 or cutout 11. This allows an increase in the number of wire bonding pads 3.

Compared with LSI, WSI involves a large number of circuit tests in its manufacturing process. The circuit tests are carried out by placing testing probes in contact with the bonding pads 3 on the WSI wafer 1. At this time, the wire bonding pads 3 could be damaged by the tips of the probes. Wire bonding made on the surfaces of damaged wire bonding pads 3 in a subsequent process causes a wiring failure. This results in a low manufacturing yield. Since each WSI device is costly, a reduction in the manufacturing yield in particular is a serious problem. As one countermeasure it is conceivable to provide separately the wire bonding pads 3 and pads for circuit testing. However, as noted hereinbefore, there is a limitation to the number of pads formed on the conventional WSI devices, and hence it is difficult to provide pads for testing purposes.

SUMMARY OF THE INVENTION

An object of this invention is to eliminate the limitation to the number of pads which is detrimental to the promotion of integration and multi-functioning of the WSI device.

Another object of this invention is to enlarge the pad-forming region of the WSI device.

A further object of this invention is to increase the number of pads on the WSI device.

A WSI device according to this invention includes an integrated circuit having a single unified function and formed on a main surface of a semiconductor substrate having a wafer scale size. This WSI comprises the semiconductor substrate including a cutout or cutouts in at least one of an inward position and an outer periphery thereof, and a plurality of pads arranged on the main surface along the outer periphery of the semiconductor substrate and along edges of the cutout or cutouts. The pads include bonding pads for wiring to outer leads, and test pads for use only in circuit testing of the integrated circuit.

According to this invention, the cutouts formed in the semiconductor substrate serve to extend peripheral regions of the semiconductor substrate. This allows an increase in the number of pads arranged peripherally of the semiconductor substrate. It is now possible to manufacture a WSI device having high-performance logic circuits requiring a multiplicity of outer electrodes or an integrated circuit including logic circuits and memory circuits.

DETAILED DESCRIPTION OF THE PREFERRED EMBODIMENTS

Embodiments of this invention will be described hereinafter with reference to the drawings.

Figure 1:
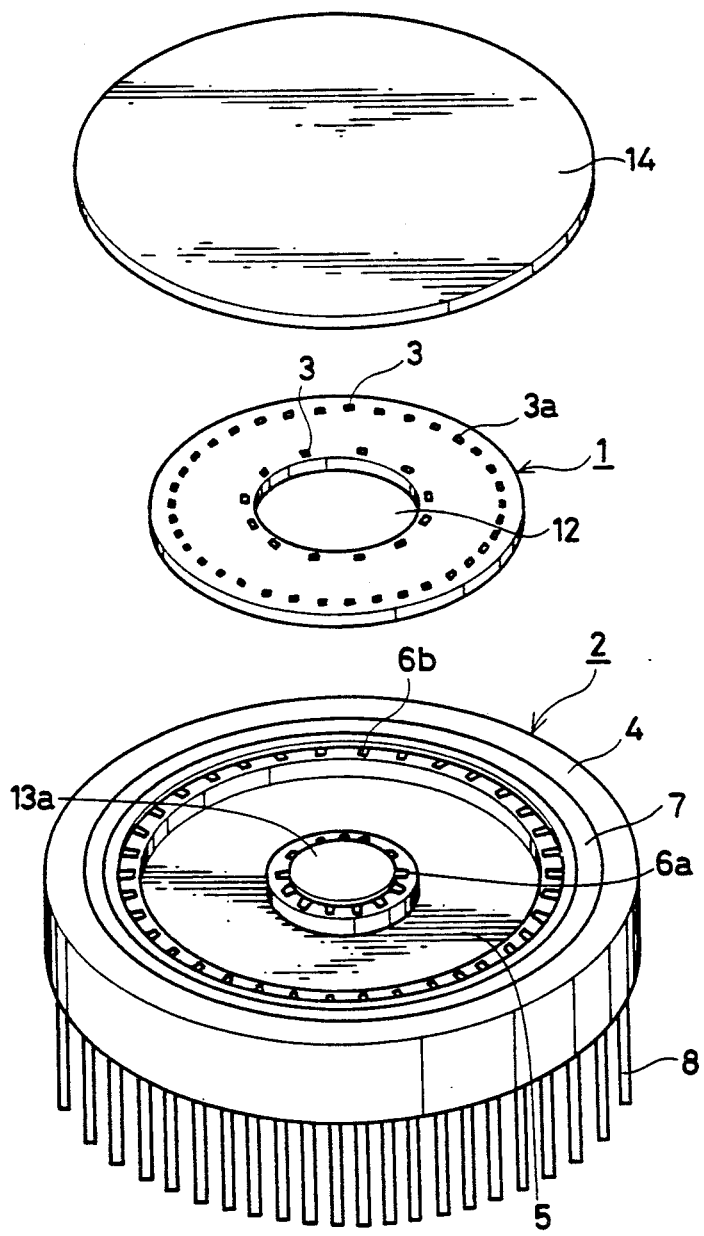
FIG. 1 is an exploded perspective view of a WSI device according to a first embodiment of the present invention.

Referring to FIG. 1, a WSI device comprises a WSI wafer 1 and a WSI package 2. The WSI wafer 1 defines a circular opening 12 centrally thereof. Further, a plurality of wire bonding pads 3 are formed peripherally of the WSI wafer 1 and peripherally of the circular opening 12. Among the plurality of wire bonding pads 3 are test pads 3a arranged at predetermined positions for use in circuit testing only.

The WSI package 2 includes a package body 4 comprising a multi-layer ceramic board. The package body 4 defines a die pad 5 centrally thereof for supporting the WSI wafer 1. The die pad 5 defines a projection 13a centrally thereof for fitting into the opening 12 of the WSI wafer 1. A plurality of inner leads 6a and 6b are formed on an outer surface of the projection 13a and peripherally of the die pad 5. The inner leads 6a and 6b correspond in number to the wire bonding pads 3 on the WSI wafer 1. Further, the inner leads 6a and 6b are connected respectively to a plurality of outer pins 8 projecting downwardly from the bottom surface of the package body 4. In addition, a seal ring 7 is formed on the upper surface of the package body 4.

The WSI wafer 1 is assembled into a predetermined position of the WSI package 2 and wire-bonded thereto. Thereafter, the upper surface of the assembly is sealed by a lid 14.

Figure 2:
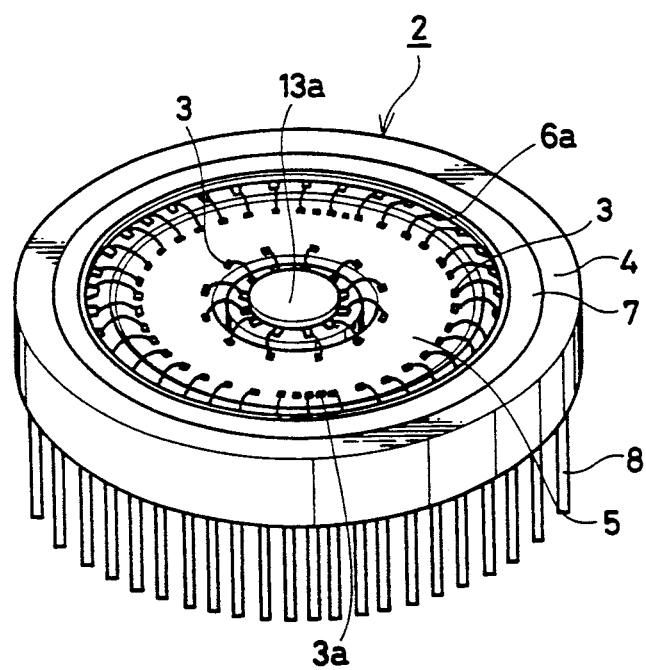
FIG. 2 is a perspective view showing a state of wire boding of the WSI device shown in FIG. 1.

Referring to FIG. 2, the wire bonding pads 3 formed along the outer and inner peripheries of the WSI wafer 1 are wired respectively to the inner leads 6a and 6b of the WSI package 2. With the configuration having the circular opening 12 centrally of the WSI wafer 1, the number of pads is increased by the number of wire bonding pads 3 formed adjacent the circular opening 12.

Figure 3:
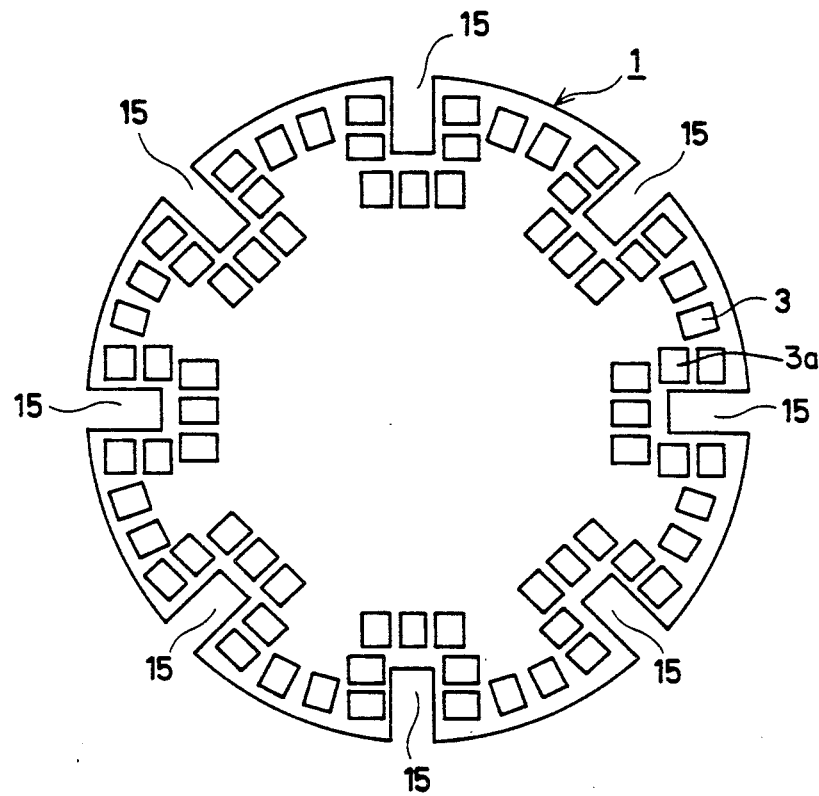
FIG. 3 is a plan view of a WSI wafer according to a second embodiment of the invention.
Figure 4:
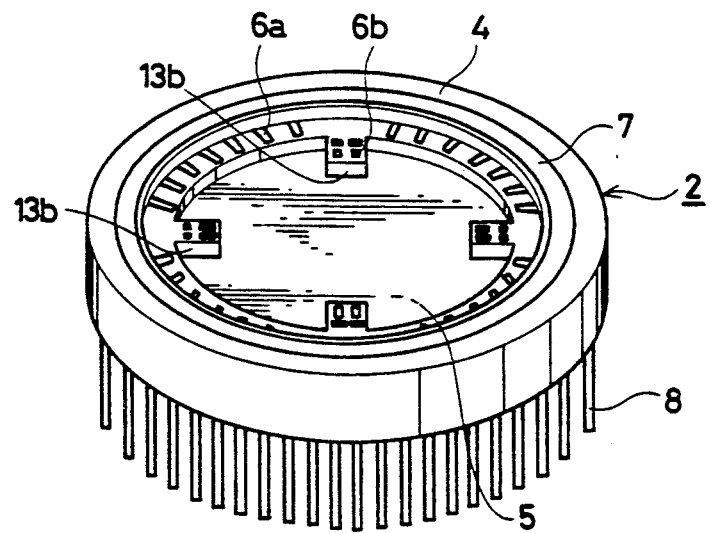
FIG. 4 is a perspective view of a WSI package for fitting the WSI wafer shown in FIG. 3.

FIGS. 3 and 4 show a second embodiment of this invention. Referring to FIG. 3, the WSI wafer 1 in this example defines a plurality of cutouts 15 peripherally thereof. Further, a plurality of wire bonding pads 3 are arranged peripherally of the WSI wafer 1 where the cutouts 15 are formed. The WSI wafer 1 defining the peripheral cutouts 15 has an increased region for forming the wire bonding pads 3 over the conventional circular WSI wafer 1. Consequently, the number of wire bonding pads 3 may be increased. At the same time, test pads 3a for use in circuit testing are formed peripherally of the WSI wafer 1.

The WSI package 2 includes a package body 4, a die pad 5 for supporting the WSI wafer 1, inner leads 6a and 6b for electrical connection to the wire bonding pads 3 on the WSI wafer 1, and outer pins 8. Further, projections 13b are formed at predetermined positions along the outer periphery of the die pad 5 for fitting into the cutouts 15 of the WSI wafer 1. The inner leads 6b are formed on the upper surfaces of the projections 13b. In the assembled state of the device, the projections 13b of the WSI package 2 fit into the cutouts 15 of the WSI wafer 1. Wire bonding is provided between adjacent wire bonding pads 3 on the WSI wafer 1 and inner leads 6b on the projections of WSI package 2.

Figure 5:
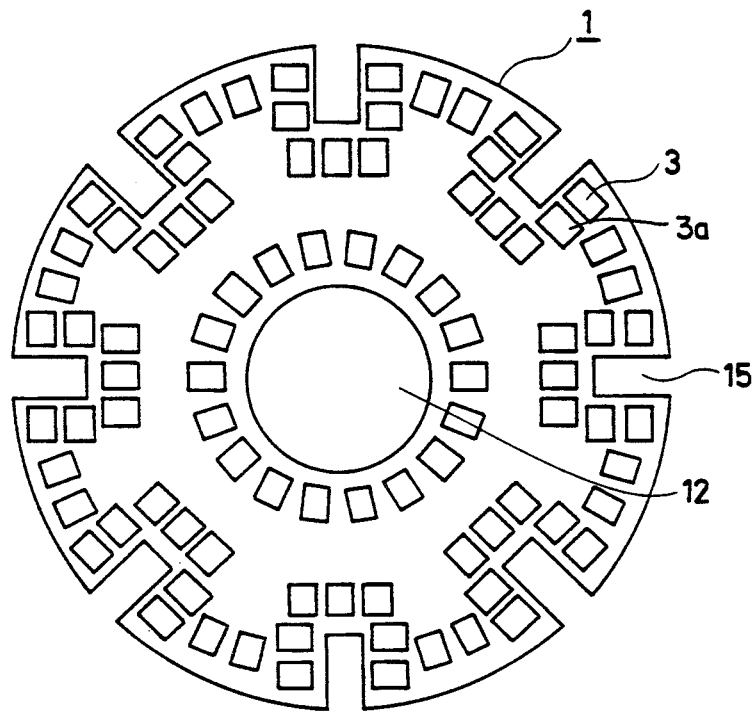
FIG. 5 is a plan view of a WSI wafer according to a third embodiment of the invention.
Figure 6:
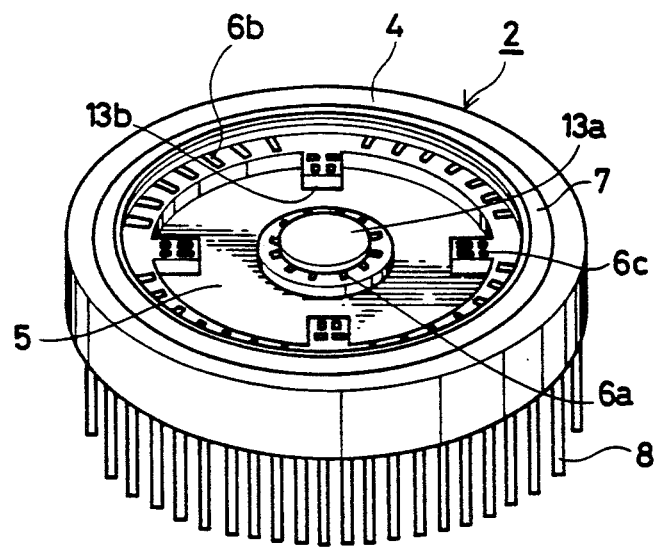
FIG. 6 is a perspective view of a WSI package for fitting the WSI wafer shown in FIG. 5.

FIGS. 5 and 6 show a third embodiment of this invention. This embodiment has a construction corresponding to the first and second embodiments combined. More particularly, the WSI wafer 1 defines a plurality of cutouts 15 and a circular opening 12 peripherally and centrally thereof, respectively. Wire bonding pads 3 are arranged along edges of the cutouts 15 and circular opening 12 of the WSI wafer 1. The wire bonding pads 3 include test pads 3a arranged at appropriate positions for use in circuit testing.

The WSI package 2 includes projections 13b and 13a disposed at respective positions of die pad 5 corresponding to the cutouts 15 and circular opening 12 of the WSI wafer 1.

Figure 7:
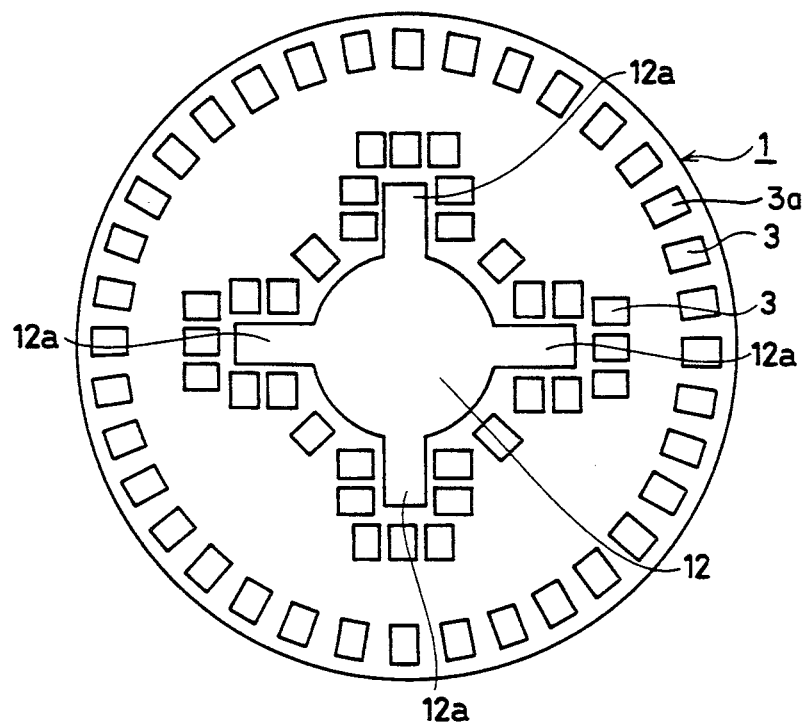
FIG. 7 is a plan view of a WSI wafer according to a fourth embodiment of the invention.
Figure 8:
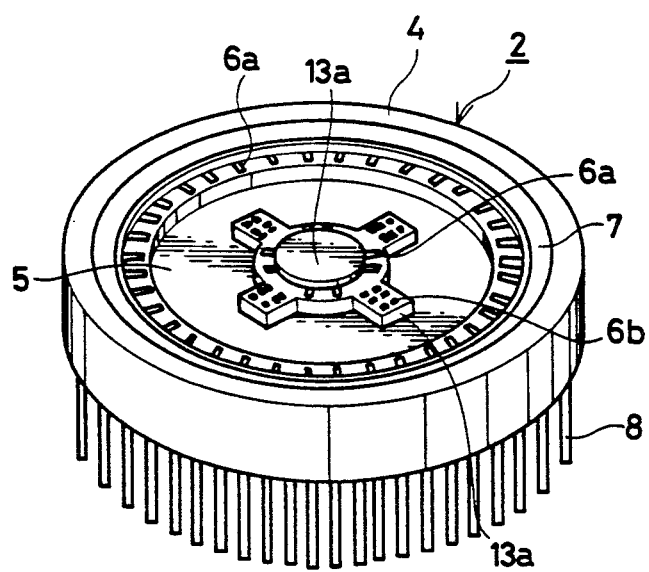
FIG. 8 is a perspective view of a WSI package for fitting the WSI wafer shown in FIG. 7.

FIGS. 7 and 8 show a fourth embodiment of this invention. Referring to FIG. 7, the WSI wafer 1 in this embodiment defines a circular opening 12 centrally thereof, and cutouts 12a extending to multiple directions from the circular opening 12. A plurality of wire bonding pads 3 are arranged along edges o the circular opening 12 and cutouts 12a and along the circular periphery of the WSI wafer 1. The wire bonding pads 3 include test pads 3a arranged at appropriate positions for use in circuit testing.

Referring to FIG. 8, the WSI package 2 includes a projection 13a disposed centrally of die pad 5 for fitting into the central opening 12 and cutouts 12a of the WSI wafer 1.

Figure 9:
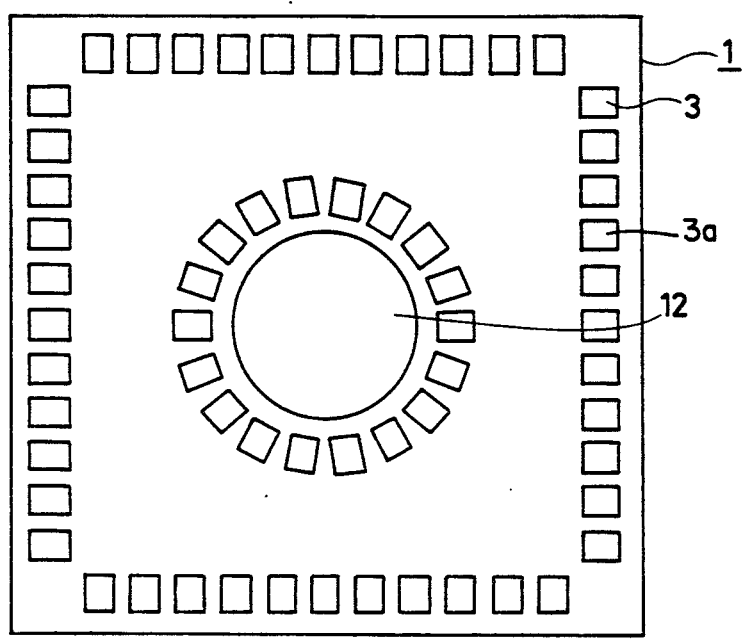
FIG. 9 is a plan view of a WSI wafer according to a fifth embodiment of the invention.
Figure 10:
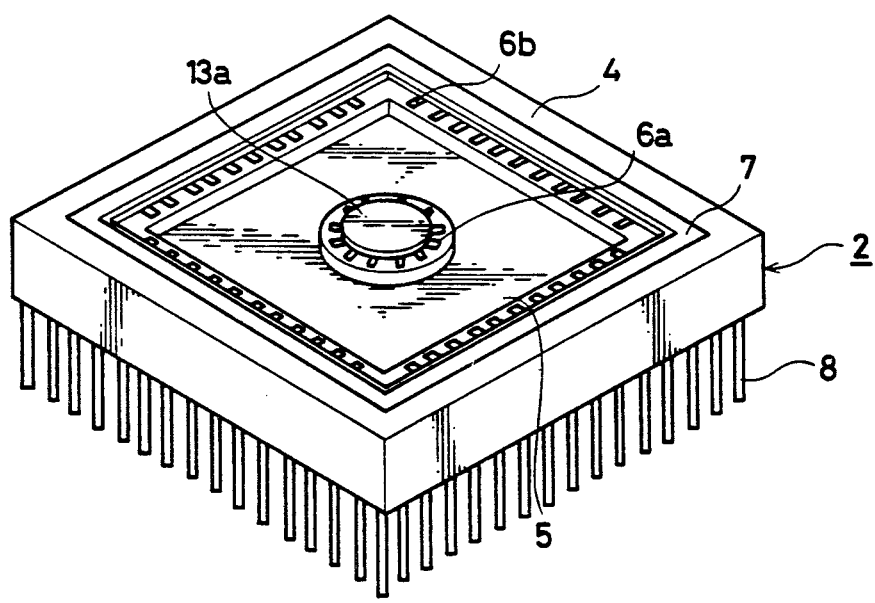
FIG. 10 is a perspective view of a WSI package for fitting the WSI wafer shown in FIG. 9.

FIGS. 9 and 10 show a fifth embodiment of this invention. Referring to FIG. 9, the WSI wafer 1 has a square shape. This WSI wafer 1 defines a circular opening 12 centrally thereof. Wire bonding pads 3 are arranged in order peripherally of the WSI wafer 1 and around the circular opening 12. Test pads 3a for circuit testing are formed at appropriate positions in the arrangement o the wire bonding pads.

Referring to FIG. 10, the WSI package 2 includes a square die pad 5 for supporting the square WSI wafer 1. The die pad 5 defines a projection 13a shaped to fit into the circular opening 12 of the WSI wafer 1. Inner leads 6a are formed on an outer surface of the circular projection 13a. Further, a plurality of inner leads 6a are formed peripherally of the die pad 5.

Figure 11:
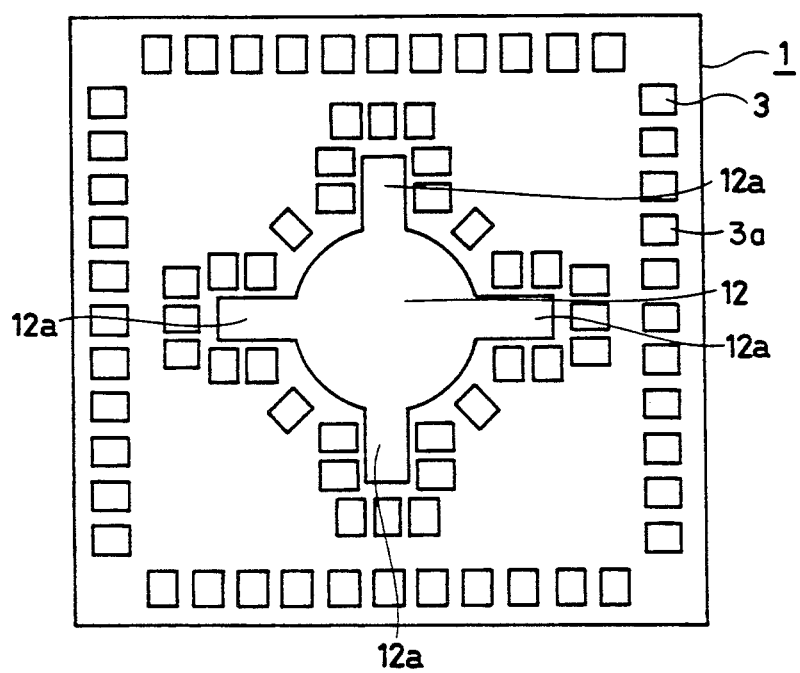
FIG. 11 is a plan view of a WSI wafer according to a sixth embodiment of the invention.
Figure 12:
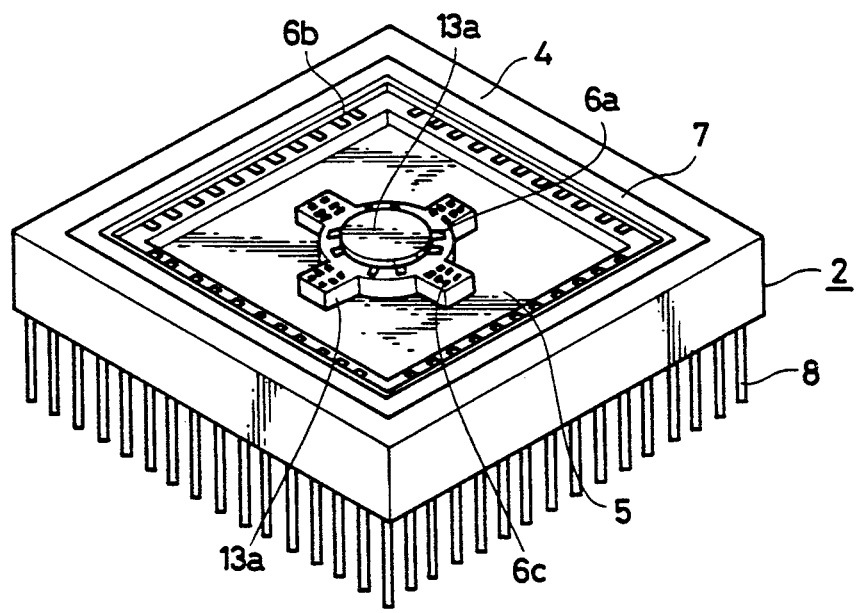
FIG. 12 is a perspective view of a WSI package for fitting the WSI wafer shown in FIG. 11.
Figure 13:
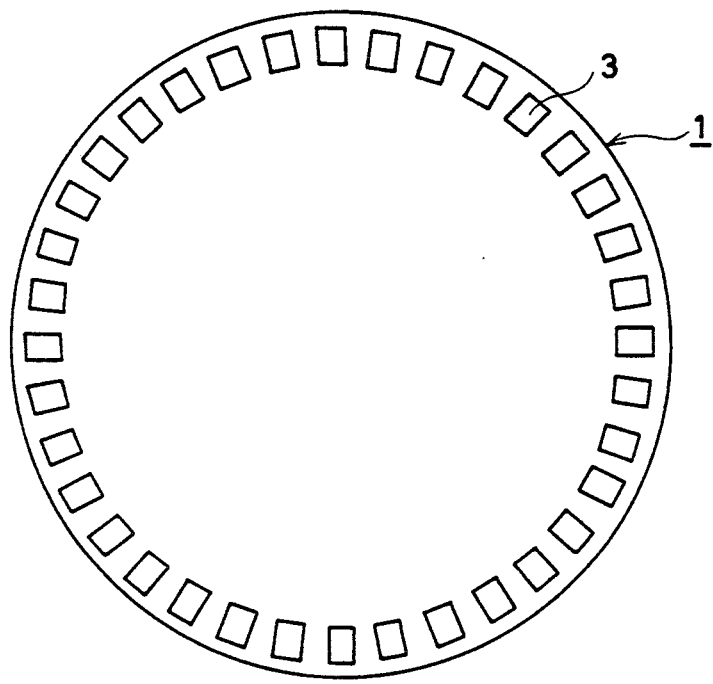
FIG. 13 is a plan view of a conventional WSI wafer.
Figure 14:
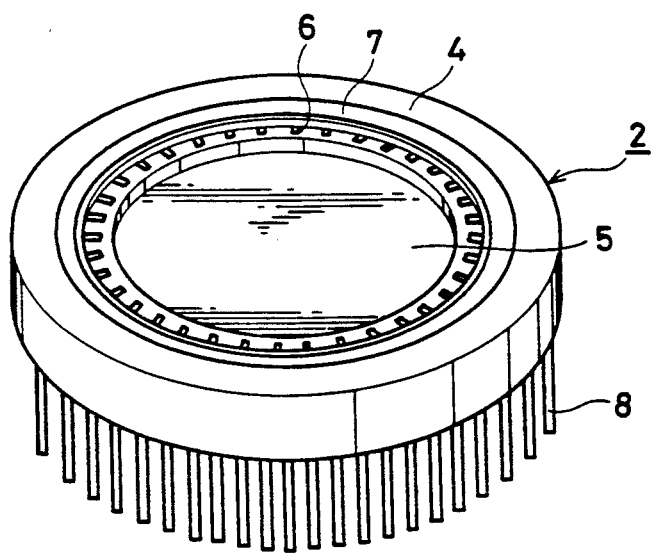
FIG. 14 is a perspective view of a WSI package for fitting the WSI wafer shown in FIG. 13.
Figure 15:
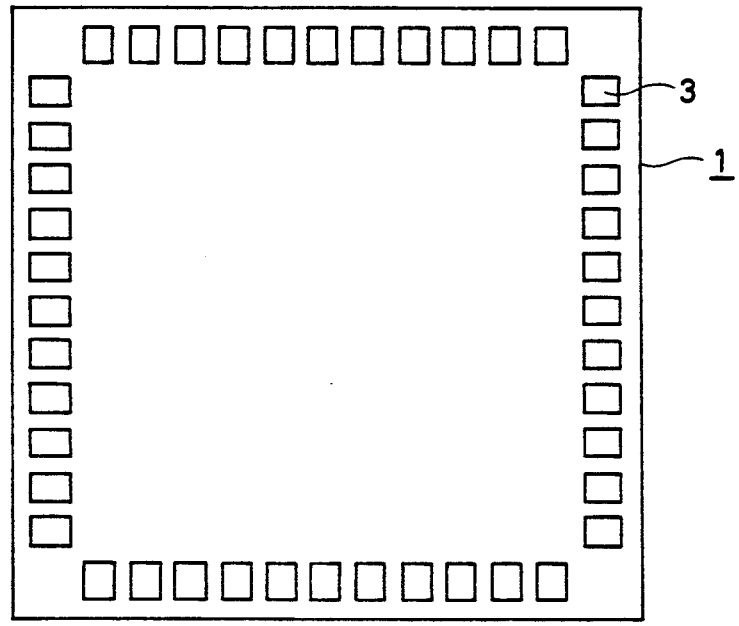
FIG. 15 is a plan view of another conventional WSI wafer.
Figure 16:
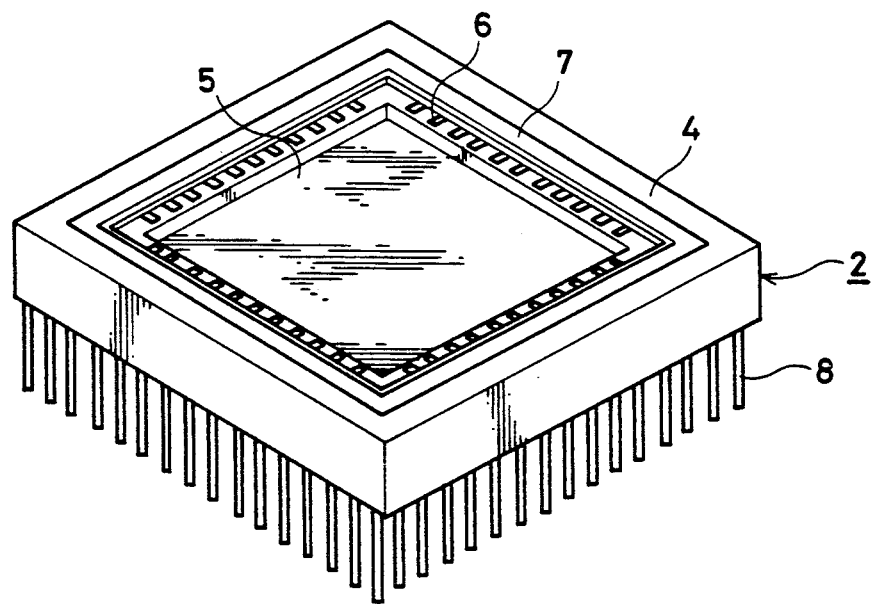
FIG. 16 is a perspective view of a WSI package for fitting the WSI wafer shown in FIG. 15, and FIGS. 17 and 18 are perspective views of conventional LSI chips, respectively.
Figure 17:
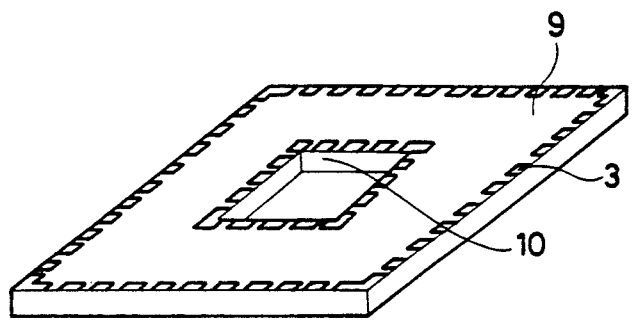
Figure 18:
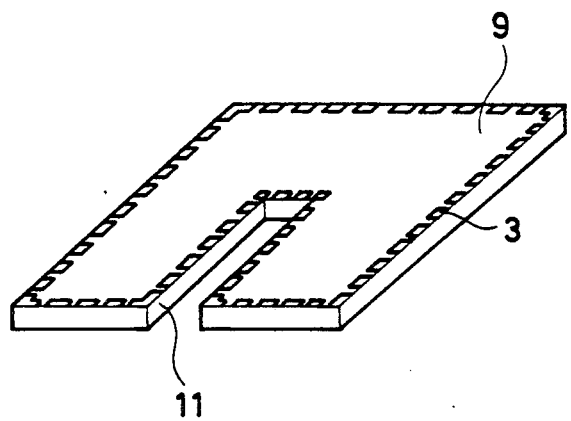

FIGS. 11 and 12 show a sixth embodiment of this invention. Referring to FIG. 11, the WSI wafer 1 has a square shape. This WSI wafer 1 defines a circular opening 12 centrally thereof, and cutouts 12a extending to multiple directions from the circular opening 12. A plurality of wire bonding pads 3 are arranged in order along the square edges o the WSI wafer 1 and along edges of the circular opening 12 and cutouts 12a. Test pads 3a for circuit testing are formed at appropriate position in the arrangement of the wire bonding pads.

Referring to FIG. 12, the WSI package 2 includes a square die pad 5 for supporting the WSI wafer 1. The die pad 5 defines a projection 13a shaped to fit into the central opening 12 and cutouts 12a of the WSI wafer 1. Inner leads 6a and 6c formed at peripheral positions on the surface o the projection 13a. Further, inner leads 6a are similarly formed peripherally of the die pad 5. The respective inner leads 6a, 6b and 6c are connected to outer pins 8.

While, in the foregoing embodiments, the WSI wafer 1 has been described as having a circular or square shape, this i not limitative but the wafer may have a rectangular or other shape.

As described above, the WSI device according to the present invention comprises a WSI wafer defining a cutout or cutouts peripherally and/or centrally thereof, thereby extending the pad-forming region. At the same time, test pads are mixed into the pad arrangement. These features allow an increase in then umber of input and output lines for communication with the exterior, thereby realizing a high-performance and high-integration circuit. Further, this invention assures an excellent manufacturing yield by eliminating the bonding failure resulting from damage done to the pads.

What is claimed is:

1. A wafer scale integration circuit formed on a main surface of a semiconductor substrate wafer, comprising:
   said semiconductor substrate wafer,
   a cutout in an outer periphery of said semiconductor substrate wafer, and
   a plurality of pads arranged on the main surface along the outer periphery of said semiconductor substrate wafer and along edges of said cutout,
   said pads including bonding pads for wiring said WSI circuit to external leads, and test pads for use only in circuit testing of said WSI circuit.

2. A WSI circuit according to claim 1, wherein said semiconductor substrate wafer is substantially disk-shaped.

3. A WSI circuit according to claim 1, wherein said semiconductor substrate wafer has substantially a shape of a square plate.

4. A WSI circuit according to claim 1, further comprising another cutout in the outer periphery of said semiconductor substrate wafer.

5. A WSI circuit according to claim 1, further comprising a circular cutout centrally located in the interior of said semiconductor substrate wafer.

6. A WSI circuit according to claim 5, further comprising another cutout located in the outer periphery of said semiconductor substrate wafer.

7. A WSI circuit according to claim 6, wherein said semiconductor substrate wafer is substantially disk-shaped.

8. A WSI circuit according to claim 6, wherein said semiconductor substrate wafer has substantially a shape of a square plate.

9. A wafer scale integration device comprising:
   a semiconductor substrate wafer,
   a wafer scale integrated circuit formed on a main surface of said semiconductor substrate wafer, and
   a package for supporting said semiconductor substrate wafer and for mounting on a predetermined external circuit board,
   said semiconductor substrate wafer including a cutout in an outer periphery thereof, and a plurality of pads arranged on the main surface along the outer periphery of said semiconductor substrate wafer and along edges of said cutout,
   said package including a mount for supporting said semiconductor substrate wafer, said mount including an inner lead portion for fitting into said cutout.

10. A wafer scale integration device comprising:
    a semiconductor wafer,
    a wafer scale integrated circuit formed on a main surface of said wafer such that said wafer serves as a substrate for said wafer scale integrated circuit,
    a cutout in an outer periphery of said wafer, and
    a plurality of pads on the main surface of said wafer arranged along said periphery of said wafer and along edges of said cutout, wherein
    said pads include bonding pads for connections to wiring leads and test pads for sue only in circuit testing of said WSI device.

11. A WSI circuit according to claim 10, further comprising a cutout in an interior position on said wafer.

12. A WSI device according to claim 1, further comprising a cutout in an interior position on said semiconductor substrate wafer.

13. A WSI device according to claim 9, further comprising a cutout in an interior position on said semiconductor substrate wafer.

* * * * *